US008861304B1

(12) United States Patent
Cope

(10) Patent No.: US 8,861,304 B1

(45) Date of Patent: Oct. 14, 2014

(54) CIRCUITRY FOR GENERATING PEAK CANCELLING PULSES

(71) Applicant: Benjamin Thomas Cope, London (GB)

(72) Inventor: Benjamin Thomas Cope, London (GB)

(73) Assignee: Altera Corporation, San Jose, CA (US)

(*) Notice: Subject to any disclaimer, the term of this patent is extended or adjusted under 35 U.S.C. 154(b) by 88 days.

(21) Appl. No.: 13/625,782

(22) Filed: Sep. 24, 2012

(51) Int. Cl.
*G11C 8/00* (2006.01)
*G11C 7/22* (2006.01)

(52) U.S. Cl.
CPC .......... *G11C 7/22* (2013.01)
USPC .......... 365/233.1; 365/199; 365/233.12; 365/230.03; 365/189.09

(58) Field of Classification Search
CPC ....... G11C 7/22; G11C 11/419; G11C 7/1075
USPC ........ 365/230.03, 199, 233.1, 189.09, 233.12
See application file for complete search history.

(56) References Cited

U.S. PATENT DOCUMENTS 6,175,551 B1 1/2001 Awater et al.
7,061,991 B2 6/2006 Wright et al.
7,590,198 B2 * 9/2009 Sanada et al. ................. 375/343
7,697,591 B2 4/2010 Copeland
2006/0062057 A1 * 3/2006 Blasi et al. .................... 365/193
2012/0163489 A1 6/2012 Ramakrishnan

* cited by examiner

*Primary Examiner* — Thong Q Le

(74) *Attorney, Agent, or Firm* — Treyz Law Group; Jason Tsai

(57) ABSTRACT

Integrated circuits with wireless communications circuitry having peak cancelling circuitry operable to perform crest factor reduction is provided. The peak cancelling circuitry may include a peak detection circuit, a delay circuit, and peak cancellation pulse generation circuitry. The peak cancellation pulse generation circuitry may include multiple pulse generation blocks coupled in a cascade configuration. Each pulse generation block may include a counter for providing memory address signals, a register for latching peak scaling factor information, a pulse memory block for storing a respective sub-pulse, and a multiplier for scaling the stored sub-pulse by the latched peak scaling factor. The pulse memory block may be implemented using single-port memory or dual-port memory. In other suitable arrangements, the peak cancellation pulse generation circuitry may include an allocator circuit and a crossbar switch for selectively coupling the counters and registers to respective pulse memory blocks and multipliers.

20 Claims, 12 Drawing Sheets

CIRCUITRY FOR GENERATING PEAK CANCELLING PULSES

BACKGROUND

This relates generally to integrated circuits, and more particularly, to integrated circuits with wireless communications circuitry.

Wireless integrated circuits such as transceiver circuits are sometimes configured to support complex, non-constant envelope modulation schemes such as the Wideband Code Division Multiple Access (W-CDMA) modulation scheme and the Orthogonal Frequency-Division Multiplexing (OFDM) modulation scheme. High frequency signals generated using such types of radio access technologies can exhibit high peak-to-average ratios (PARs), which can adversely impact the efficiency of radio-frequency power amplifiers used in wireless base transceiver stations (as an example). Reducing the PAR of these signals can help increase power amplifier efficiency and allows for higher average power to be transmitted.

In an effort to reduce signal PAR, a crest factor reduction (CFR) algorithm has been developed that involves iteratively cancelling unwanted signal peaks using a set of kernel impulses. A typical CFR processor includes a peak detection unit and multiple pulse memory blocks. When the CFR processor receives an input waveform, the peak detection unit is used to determine where the input waveform exceeds a predetermined peak magnitude threshold. The peak detection unit then directs the pulse memory blocks to output corresponding kernel impulses. Each kernel impulse is aligned (i.e., magnitude and phase are adjusted) to a corresponding peak in the input waveform. The different kernel impulses are summed to create a cancellation waveform. The summed cancellation waveform is subtracted from a delayed version of the input waveform to produce an output waveform with reduced PAR.

In the convention CFR processor, each pulse memory block stores an identical copy of an entire kernel impulse signal. In order to concurrently cancel a large number (for example 10) of unwanted signal peaks using the conventional CFR processor, an acceptably large number of pulse memory blocks may be required.

SUMMARY

Integrated circuits may include wireless communications circuitry having peak cancelling circuitry configured to perform crest factor reduction. The peak cancelling circuitry may include a delay circuit for delaying an input waveform, a peak detection circuit operable to detect undesired peaks in the input waveform, peak cancellation waveform generation circuitry that is used to generate peak cancellation pulses, and a subtraction circuit that subtracts the peak cancellation pulses from the input waveform to generate an output waveform with reduced peaks.

In one suitable arrangement of the present invention, the peak cancellation waveform generation circuitry may include multiple pulse generation circuits and a summing circuit. Each of the pulse generation circuits may include a counter, a register, a pulse memory block, and a multiplying circuit. The peak detection circuit may be coupled to only one of the pulse generation circuits. The counters in the pulse generation circuits may be coupled in series. The registers in the pulse generation circuits may also be coupled in series.

The pulse memory blocks may be configured to store respective portions of a band-limited pulse signal (e.g., a sinc pulse). The multiplying circuits may receive read data from the pulse memory blocks and scaling factor information from the registers and may output corresponding sub-pulses. The summing circuit may be used to combine the different sub-pulses to generate a peak cancellation pulse signal that is used to cancel out a detected peak in the input waveform.

In another suitable arrangement of the present invention, the peak cancellation wave generation circuitry may include multiple pulse generation circuits, a summing circuit, an allocator circuit, and a crossbar switch. Each of the pulse generation circuits may include a counter, a register, a pulse memory block, and a multiplying circuit. The pulse memory blocks may be configured to store respective portions of a band-limited pulse signal.

The allocator circuit may receive control signals from the peak detection circuit and may selectively route the received control signals to different pulse generation circuits. The crossbar switch may be configured to sequentially couple the counters and registers in one pulse generation circuit to multiplying circuits in each of the different pulse generation circuits. The multiplying circuits may receive read data from the pulse memory blocks and scaling factor information from the registers and may output corresponding sub-pulses. The summing circuit may be used to combine the different sub-pulses to generate a peak cancellation pulse signal that can be used to cancel out a detected peak in the input waveform.

In either arrangement, the pulse memory blocks may be implemented using single-port memory elements or dual-port memory elements. In the dual-port memory implementation, each pulse memory block may be addressed using at least two counters. If desired, each pulse memory block may include first and second memory banks to support wireless communications with frequency hopping. At any given point in time, only one of the two memory banks is active while the other is idle.

Consider a scenario in which the first memory bank is active and the second memory bank is idle during a first time period. During the first time period, data may be read out from the first memory bank to generate a corresponding sub-pulse while new data is being loaded into the second memory bank. Each of the first and second memory banks may be configured to store fractions of respective pulse signals that are centered at different frequencies. During a second period immediately following the first period, the second memory bank is now active while the first memory bank is idle. Generation of sub-pulses may alternate between the two banks to successively generate sub-pulses at different center frequencies.

Further features of the present invention, its nature and various advantages will be more apparent from the accompanying drawings and the following detailed description.

DETAILED DESCRIPTION

Figure 1:
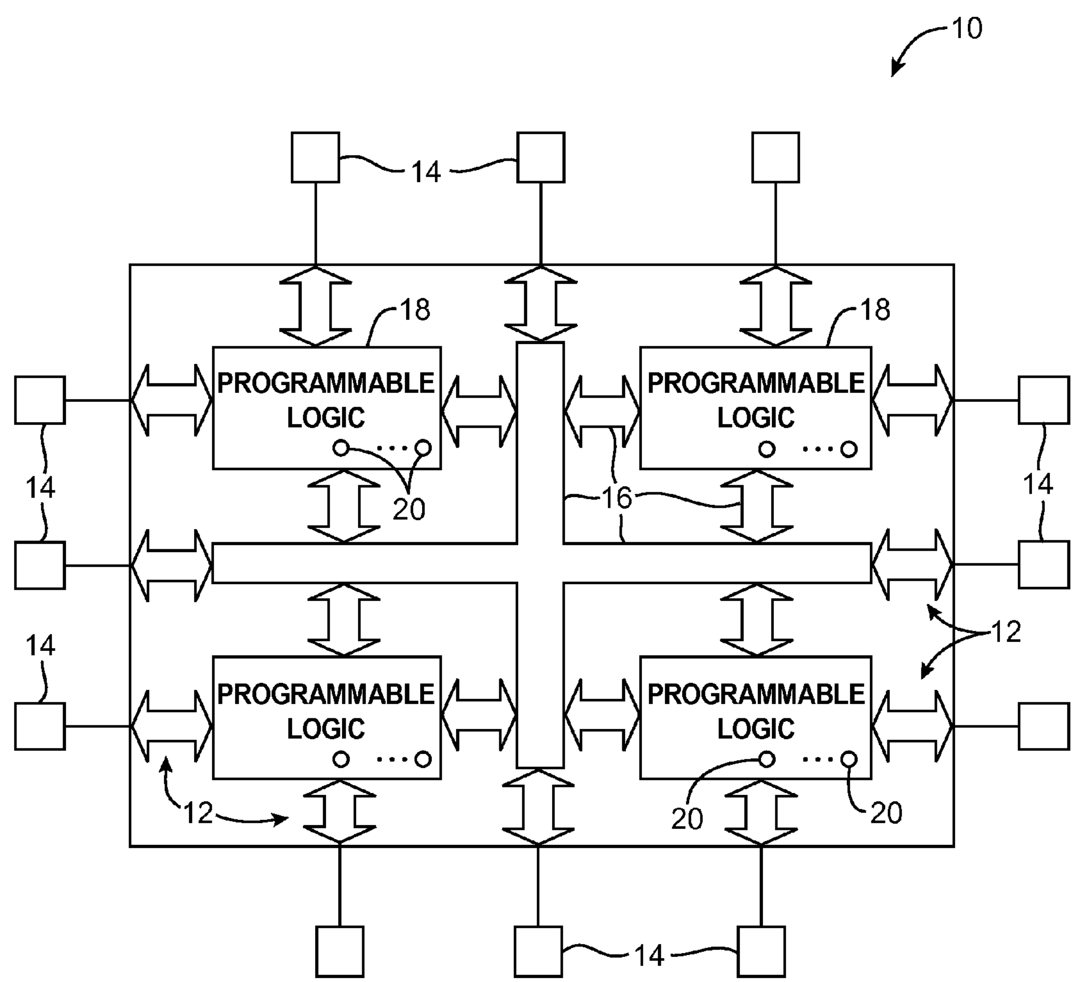
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

The example of FIG. 1 in which device 10 is described as a programmable integrated circuit is merely illustrative and does not serve to limit the scope of the present invention. The method and apparatus described herein may be incorporated into any suitable circuit. For example, the method and apparatus may also be incorporated into numerous types of devices such as microprocessors, digital signal processors, application specific standard products (ASSPs), application specific integrated circuits (ASICs), programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just to name a few.

Figure 2:
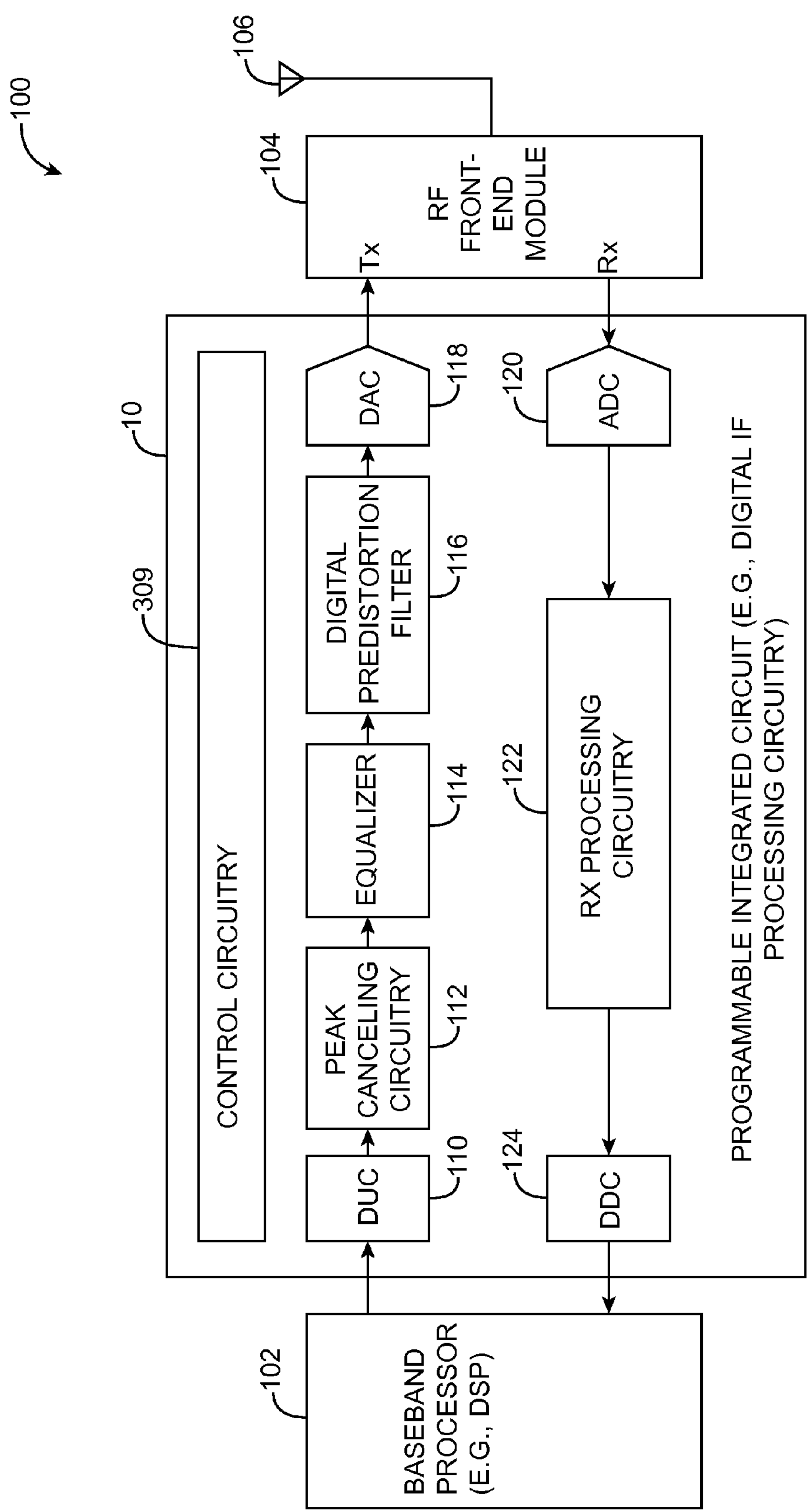
FIG. 2 is a diagram of illustrative wireless communications circuitry in accordance with an embodiment of the present invention.

In one suitable embodiment of the present invention, integrated circuits are used in wireless communications circuitry that supports radio-frequency communications capabilities. As shown in FIG. 2, wireless communications circuitry such as wireless communications circuitry 100 may include a baseband processor 102, digital intermediate frequency (IF) processing circuitry implemented using a programmable integrated circuit 10 (as an example), a radio-frequency front-end module 104, and an antenna 106.

Baseband processor 102 may be used to handle raw and processed data associated with wireless (antenna) performance metrics for received signals such as received power, transmitted power, frame error rate, bit error rate, channel quality measurements based on signal-to-interference ratio (SINR) and signal-to-noise ratio (SNR) information, channel quality measurements based on signal quality data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 100.

Processor 102 may directly interface with a transceiver circuit such as device 10 (sometimes referred to as a transceiver chip). Device 10 may include in its transmit path a digital up-converter (DUC) 110, peak cancelling circuitry 112, an equalizer circuit 114, a digital predistortion (DPD) filter 116, and a digital-to-analog converter (DAC) 118 and may include in its receive path an analog-to-digital converter (ADC) 120, receive (RX) processing circuit 112, and a digital down-converter (DDC) 124. Device 10 may also include control circuitry 309 for controlling the operations of the different circuits in the transmit and receive paths.

When wireless communications circuitry 100 is transmitting wireless signals, processor 102 may provide digital data (e.g., baseband signals) to device 10. In particular, DUC 110 may convert or modulate the baseband digital signals to an intermediate frequency (IF) to produce IF digital signals. The IF digital signals may then be fed through peak cancelling circuitry 112 to reduce the dynamic range of the IF digital signals (e.g., for performing crest factor reduction operations on the IF digital signals). The IF signals may then be fed through equalizer 114 (to compensate for attenuation at high frequencies) and digital predistortion filter 116 (to help linearize power amplification at radio frequencies). The filtered IF digital signals may be converted to IF analog signals using DAC 118. The IF analog signals may then be provided to a transmit (TX) port in RF front end module 104.

When wireless communications circuitry 100 is receiving wireless signals, RF front end 104 may provide incoming IF analog signals to ADC 120 via its receive (RX) port. ADC 120 in device 10 may convert the incoming IF analog signals to incoming IF digital signals. The incoming IF digital signals may then be fed to DDC 124 via RX processing circuitry 122 (e.g., circuitry for performing desired filtering and/or amplification at IF frequencies). DDC 124 may convert the incoming IF digital signals to incoming baseband digital signals. The incoming baseband digital signals may then be provided to processor 102 for further processing.

RF front end 104 may include circuitry that couples transceiver chip 10 to antenna 106. RF front end module 104 may include circuitry such as matching circuits, band-pass filters, mixers, a low noise amplifier (LNA), a power amplifier (PA), etc. Front-end module 104 may be used to up-convert IF analog signals to RF analog signals during wireless transmission to mobile stations (as an example) and may be used to down-convert RF analog signals received from the mobile stations to IF analog signals.

Wireless communications systems that support non-constant envelope schemes such as the Wideband Code Division Multiple Access (W-CDMA) modulation scheme and the Orthogonal Frequency-Division Multiplexing (OFDM) modulation scheme often generate signals having high peak-to-average ratios (PARs). Peak cancellation circuitry 112 may serve to remove any undesired peaks in the IF digital signal prior to wireless transmission, which helps to reduce PAR and increase power amplifier efficiency.

Figure 3:
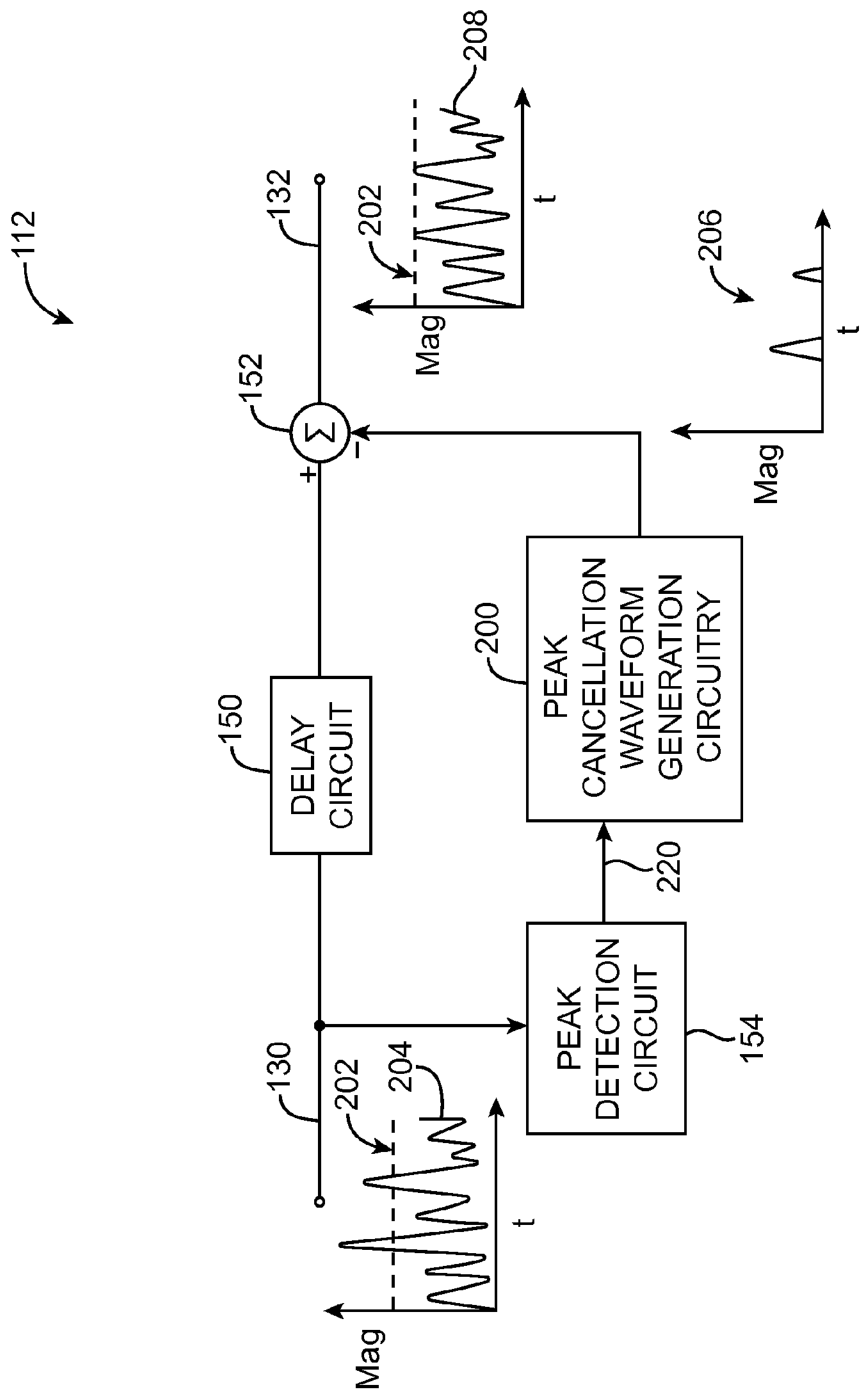
FIG. 3 is a diagram of illustrative peak cancelling circuitry in accordance with an embodiment of the present invention.

FIG. 3 is a general block diagram of peak cancellation circuitry 112. As shown in FIG. 3, circuitry 112 may include at least a peak detection circuit 154, peak cancellation waveform generation circuitry 200, a subtraction circuit 152, and a delay circuit 150. Circuitry 112 may have an input terminal 130 that receives an input waveform from DUC 110 (see, e.g., input waveform 204 in the example of FIG. 3). Waveform 204 may exhibit unwanted peaks that exceed a predetermined magnitude threshold level 202. Peak detection circuit 154 may be used to monitor input waveform 204 to detect when waveform 204 exceeds threshold level 202. For example, peak detection circuit 154 may temporarily provide asserted control signals to peak cancellation waveform generation circuitry 200 via path 220 in response to detecting an unwanted signal peak. Peak cancellation waveform generation circuitry 200 may serve to output a peak cancellation waveform such as waveform 206 containing signal impulses with magnitudes that are proportional to the amount by which the unwanted peaks exceed level 202.

Subtractor 152 may have a first (positive) input that receives a delayed version of input waveform 204 via delay circuit 150, a second (negative) input that receives peak cancelling waveform 206 from circuitry 200, and an output on which an output waveform 208 is provided. The output of subtraction circuit 152 may serve as an output terminal 132 for circuitry 112. Output waveform 208 may be generated by subtracting cancelling waveform 206 received at the second input of circuit 152 from the delayed input waveform received the first input of circuit 152. As shown in FIG. 3, output waveform 208 may be a clipped version of input waveform 204 (e.g., output waveform 208 is substantially identical to input waveform 204 except waveform 208 does not exceed threshold level 202). Cancelling unwanted signal peaks using this approach can allow higher average signal power to be transmitted before saturation occurs.

Figure 4:
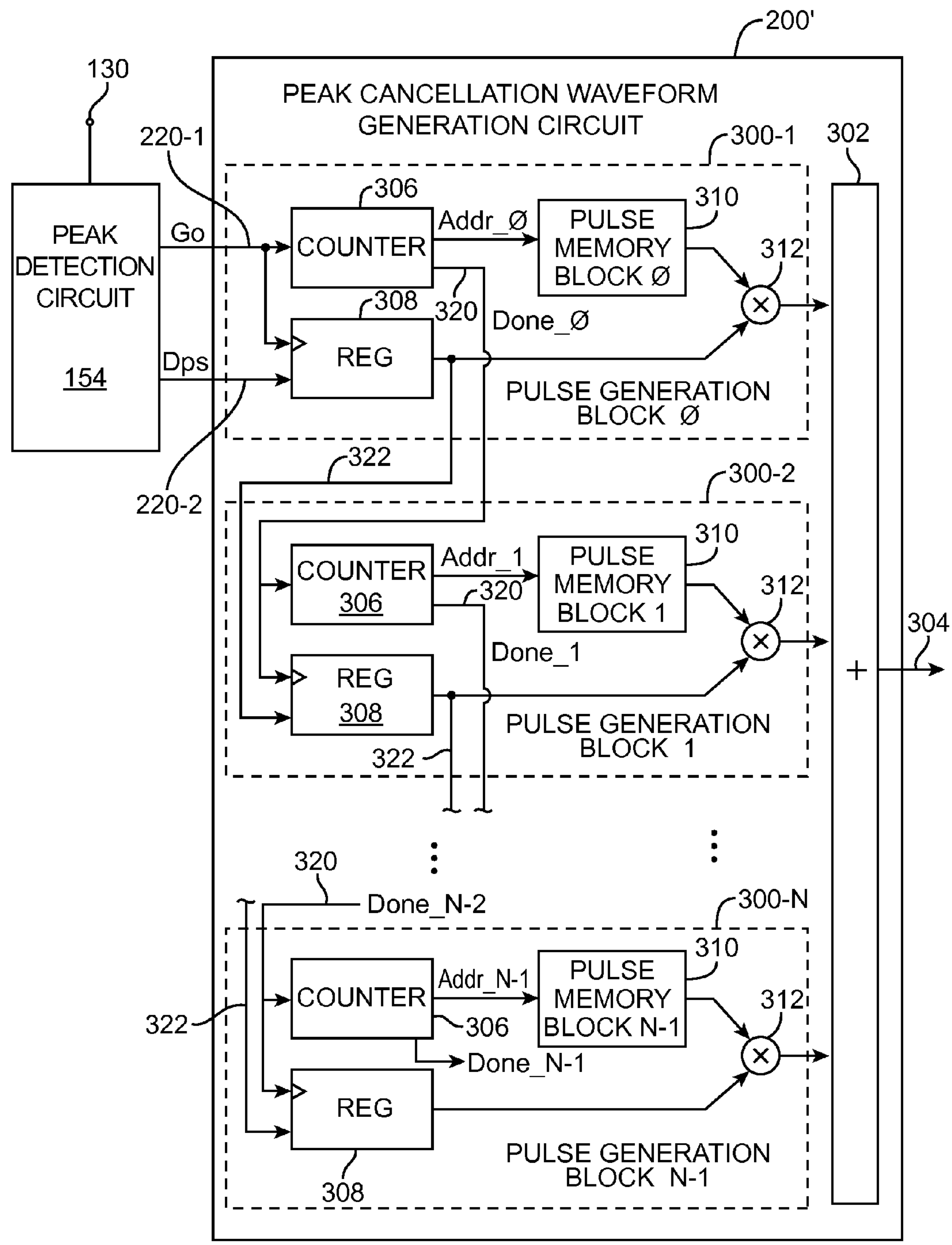
FIG. 4 is a diagram of an illustrative peak cancellation waveform generation circuit operable in a pipeline mode in accordance with an embodiment of the present invention.

Peak cancellation waveform generation circuitry may include at least one peak cancellation waveform generation circuit. FIG. 4 shows one suitable arrangement of a peak cancellation waveform generation circuit 200'. As shown in FIG. 4, circuit 200' may include multiple pulse generation blocks 300 (e.g., circuit 200' may include a first pulse generation circuit 300-1, a second pulse generation circuit 300-2, a third pulse generation circuit 300-3, . . . , and an N-th pulse generation circuit 300-N) and a summing circuit (or signal combiner) 302. Peak detection circuit 154 may send control signals to only the first pulse generation block 300-1 via path 220. In response to detecting an unwanted peak in an input waveform received on input terminal 130, peak detection circuit 154 may output an asserted Go signal and a corresponding scaling factor Dps via paths 220-1 and 220-2, respectively. For example, pulse generation block 300-1 may receive an asserted signal Go on path 220-1 whenever peak detection circuit 154 detects excessive signal peaking may receive a corresponding peak scaling factor Dps via path 220-2. Peak scaling factor Dps output by peak detection circuit 154 may be proportional to the amount by which a detected peak exceeds a predetermined magnitude threshold.

Figure 5:
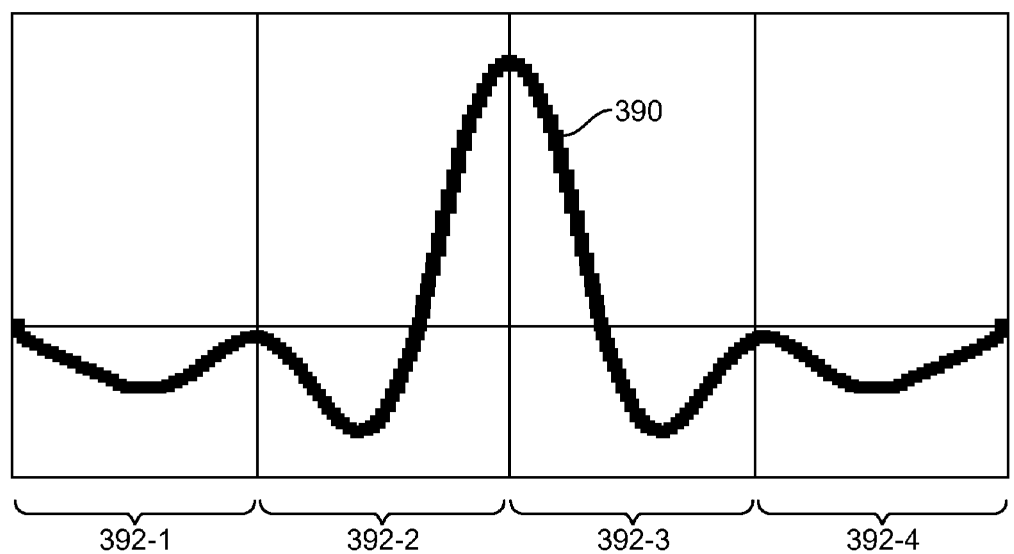
FIG. 5 is a diagram of an illustrative sinc pulse in accordance with an embodiment of the present invention.

Each pulse generation block 300 may include a counter 306, a register 308, a pulse memory block 310, and a scaling (multiplying) circuit 312. Pulse memory blocks 310 may collectively be used to store a single kernel impulse signal such as a sinc pulse 390 (see, e.g., FIG. 5). In the example of FIG. 5, peak cancellation waveform generation circuit 200' includes four pulse generation blocks (i.e., N is equal to four). In this example, pulse generation block 300-1 may be used to store samples associated with a first portion 392-1 of sinc pulse 390; pulse generation block 300-2 may be used to store samples associated with a second portion 392-2 of sinc pulse 390; pulse generation block 300-3 may be used to store samples associated with a third portion 392-3 of sinc pulse 390; and pulse generation block 300-4 may be used to store samples associated with a fourth portion 392-4 of sinc pulse 390. For example, each pulse memory block 310 may be used to store 128 pulse samples each of which is represented using a 32-bit word. Sinc pulse 390 may be a band-limited signal centered at a selected frequency. If desired, pulse memory blocks 310 may be used to store samples for other types of band-limited signals. If desired, each pulse memory block 310 may be used to store more or less than 128 samples.

Counter 306 may be configured to monotonically increment from an initial value a predetermined number of times that is equal to the number of samples that is stored in pulse memory block 310 in response to detecting an asserted signal at its control input. In the example above in which each pulse memory block 310 stores 128 samples, counter 306 may count up at least 128 times before looping back to its initial value to wait for the next Go signal on path 220-1. This predetermined count that counter 306 is counting up towards before looping back to its initial value may be referred to as a target count value.

In FIG. 4, pulse generation block 300-1 may include a first counter 306, a first register 308, a first pulse memory block 310, and a first multiplier 312. First counter 306 may receive at its control input signal Go via path 220-1 and may output an address signal Addr_0 and an alert signal Done_0. Before signal Go is asserted, signal Addr_0 may be reset to an initial address value. When Go is asserted, first counter 306 may begin incrementing Addr_0. First pulse memory block 310 may be addressed using signal Addr_0. For example, a first sample in first pulse memory block 310 may be selected for readout when Addr_0 is equal to its initial reset value, whereas a second sample in first pulse memory block 310 may be selected for readout when Addr_0 is incremented (e.g., successive samples in the first pulse memory block may be selected for readout as Addr_0 is being incremented). Data that is read out from first pulse memory block 310 as signal Addr_0 is being incremented may be received by first multiplier 312.

First register 308 may have a data input that receives signal Dps via path 220-2, a clock input that receives signal Go via path 220-1, and a data output. When Go is asserted, first register 308 may latch signal Dps currently presented at its data input and may subsequently provide the latched Dps at its data output. Scaling factor Dps that is latched by first register 308 may be fed to first multiplier 312. First multiplier 312 may serve to adjust each sample that is read out from first pulse memory block 310 by scaling factor Dps and output a first scaled cancellation sub-pulse to summing circuit 302 (e.g., first multiplier 312 may output a first scaled portion of the desired cancellation pulse).

Pulse generation block 300-2 may include a second counter 306, a second register 308, a second pulse memory block 310, and a second multiplier 312. Second counter 306 may receive at its control input signal Done_0 from first counter 306 via path 320 and may output address signal Addr_1 and signal Done_1. Signal Done_0 may be asserted when the last sample in first pulse memory block 310 has been read out (e.g., when first counter 306 has reached its target count or before first counter 306 is reset to its initial value). Before Done_0 is asserted, signal Addr_1 may be reset to an initial address value. When Done_0 is asserted, second counter 306 may begin incrementing Addr_1. Second pulse memory block 310 may be addressed using signal Addr_1. Data that is read out from second pulse memory block 310 as signal Addr_1 is being incremented may be received by second multiplier 312.

Second register 308 may have a data input that receives signal Dps pass down from the preceding register 308 (i.e., the first register 308) via path 322, a clock input that receives signal Done_0 via path 320, and a data output. When Done_0 is asserted, second register 308 may latch signal Dps at its input and present the latched Dps at its output. The latched scaling factor Dps may be fed to second multiplier 312. Second multiplier 312 may serve to scale each sample that is read out from second pulse memory block 310 by scaling factor Dps and output a second scaled cancellation sub-pulse portion to summing circuit 302 (e.g., second multiplier 312 may output a second scaled portion of the desired cancellation pulse).

The "Done" signal may therefore serve to sequentially trigger activation of each successive pulse generation block 300 when the preceding block 300 has finished generating a cancellation sub-pulse. Scaling factor Dps may be passed from one pulse generation block to the next by relaying signal Dps from one register 308 to another. Summing circuit 302 may receive a respective scaled cancellation sub-pulse from each pulse generation block 300 and may be used to sum the respective scale cancellation sub-pulses to produce a corresponding cancellation pulse on output path 304. A cancellation pulse generated using this approach may then be fed to subtraction circuit 152 to cancel out the detected peak (see, FIG. 3).

Figure 6:
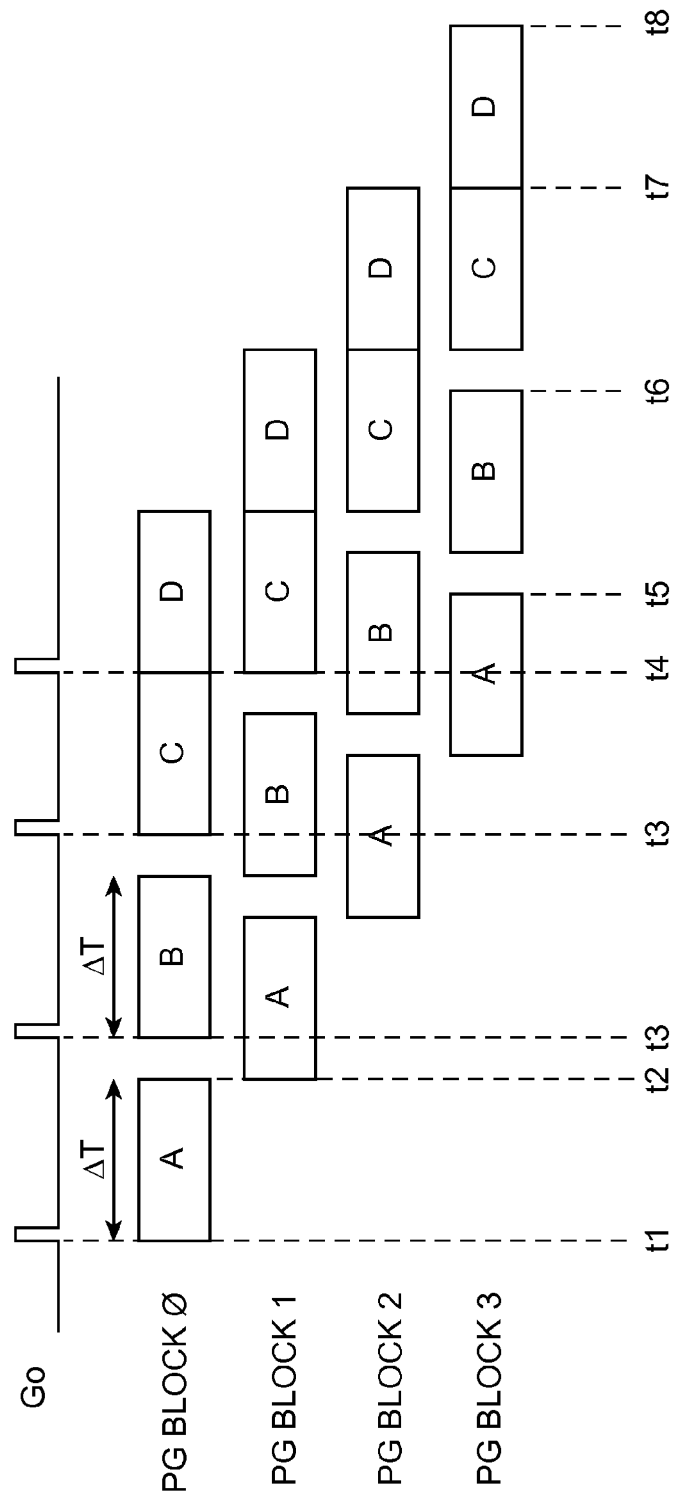
FIG. 6 is a timing diagram illustrating the operation of the peak cancellation waveform generation circuit of FIG. 4 in accordance with an embodiment of the present invention.

FIG. 6 is a timing diagram illustrating the operation of peak cancellation waveform generation circuit 200' of the type described in connection with FIG. 4. At time t1, peak detection circuit 154 may assert signal Go. Signal Go being asserted may trigger the first pulse generation block 300-1 (i.e., PG block 0) to begin generating a first peak cancelling sub-pulse A (e.g., counter 306 in the first pulse generation block may begin incrementing at time t1).

At time t2, Done_0 may be asserted to indicate that PG block 0 has finished generating first pulse-pulse A and is ready to start generating another peak cancelling sub-pulse. At time t2, the second pulse generation block 300-2 (i.e., PG block 1) may begin generating a second peak cancelling sub-pulse A. The generation of each sub-pulse A may be performed in succession using each PG block 300 in circuit 200' until the last PG block asserts its Done signal. For example, at time t5, sub-pulses A that have been generated from each of the four PG blocks 300 can be combined with other cancellation pulses using summing circuit 302 and used to cancel the detected peak which triggered the assertion of Go at time t1. For example, sub-sub-pulse A generated from PG block 1 overlaps with sub-pulse B generated from PG block 0 and are therefore combined using summing circuit 302. As another example, sub-pulse B that is generated from PG block 2 overlaps with sub-pulse C that is generated from PG block 1 and can be combined using summing circuit 302.

The time it takes for one PG block to complete its operation is marked in FIG. 6 as ΔT (e.g., ΔT may be equal to the amount of time it takes for counter 306 to count up from its initial reset value to a predetermined threshold that is equal to the number of pulse samples that is stored in pulse memory block 310). In general, the maximum frequency at which signal Go should be asserted should be no greater than 1/ΔT (e.g., an asserted Go and associated pulse scaling factor Dps should be provided to peak cancellation waveform generation circuit 200' no more than once every ΔT interval).

At time t3, peak detection circuit 154 may detect another peak to be cancelled and may assert signal Go. This will trigger PG block 0 to begin generating a first peak cancelling sub-pulse B and counter 306 in PG block 0 may being incrementing from its initial value. Generation of sub-pulses B may be successively performed using each of the PG blocks in the same way that sub-pulses A are generated. At time t6, sub-pulses B that have been generated from each of the four PG blocks 300 can be combined using summing circuit 302 and used to cancel the detected peak which triggered the assertion of Go at time t2.

In the example of FIG. 6, PG block 0 is used to generate sub-pulse B while PG block 1 is concurrently being used to sub-pulse A. In other words, it is possible that each individual PG block is generating sub-pulses corresponding to different detected peaks. This approach in which PG blocks 300 are connected in series and in which different sub-pulses can be generated in parallel may sometimes be referred to as operating circuit 200' in pipeline mode.

Signal Go may be asserted at times t3 and t4 to trigger generation of sub-pulses C and D, respectively. At time t7, sub-pulses C that have been generated from each of the four PG blocks can be combined using summing circuit 302 and used to cancel the detected peak which triggered the assertion of Go at time t3. At time t8, sub-pulses D that have been generated from each of the four PG blocks can be combined using summing circuit 302 and used to cancel the detected peak which triggered the assertion of Go at time t4. This example in which circuit 200' only includes four PG blocks 300 is merely illustrative and does not serve to limit the scope of the present invention. If desired, circuit 200' may include more than four or less than four pulse generation blocks 300 connected in a pipeline configuration. Each pulse memory block 310 may be configured to store any number of samples, and counter 306 may be operable to count up to the any suitable target value before being reset.

Figure 7:
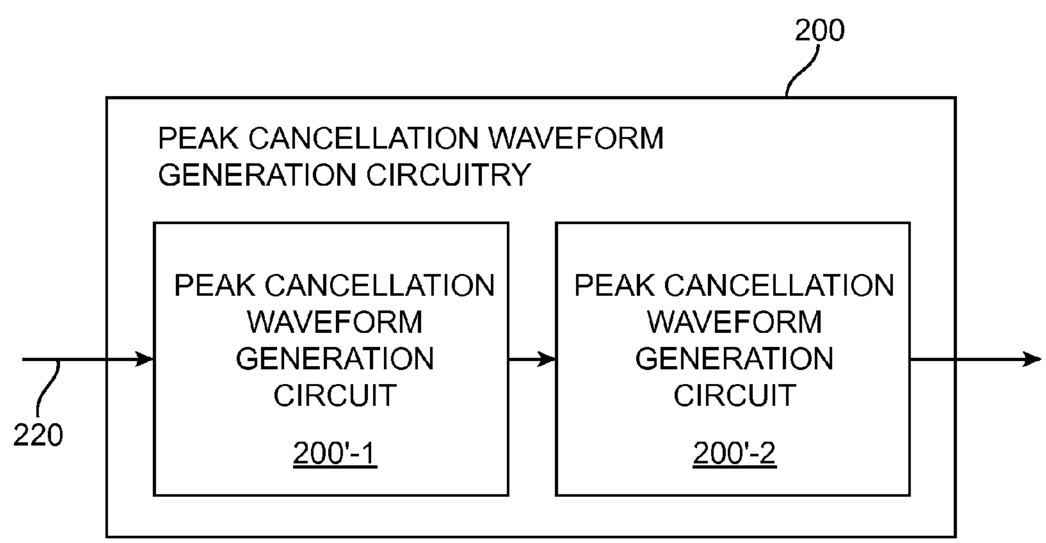
FIG. 7 is a diagram of illustrative peak cancellation waveform generation circuitry for iteratively cancelling signal peaks in accordance with an embodiment of the present invention.

Peak cancellation waveform generation circuitry 200 may include more than one peak cancellation waveform generation circuit 200' for iteratively cancelling more than one peak per ΔT (see, e.g., FIG. 7). As shown in FIG. 7, circuitry 200 may include a first peak cancellation waveform generation circuit 200'-1 connected in series with a second peak cancellation waveform generation circuit 200'-2. Consider a scenario in which circuit 200'-1 includes four PG blocks 300 each of which is configured to store 128 samples. As a whole, circuit 200'-1 may therefore generate one peak cancellation pulse for every 128 samples in an input waveform. In this example, if the input waveform includes two peaks within the first 128 samples, circuit 200' would only be capable of reducing one of the two peaks.

In order to cancel out additional peaks that are closely spaced, second circuit 200'-2 may serve to perform a second peak cancelling iteration for reducing peaks that would have otherwise been left unaltered if the input waveform is only passed through circuit 200'-1. If desired, circuitry 200 may include at least three, at least five, or any suitable number of peak cancellation waveform generation circuits 200' coupled in series.

Figure 8:
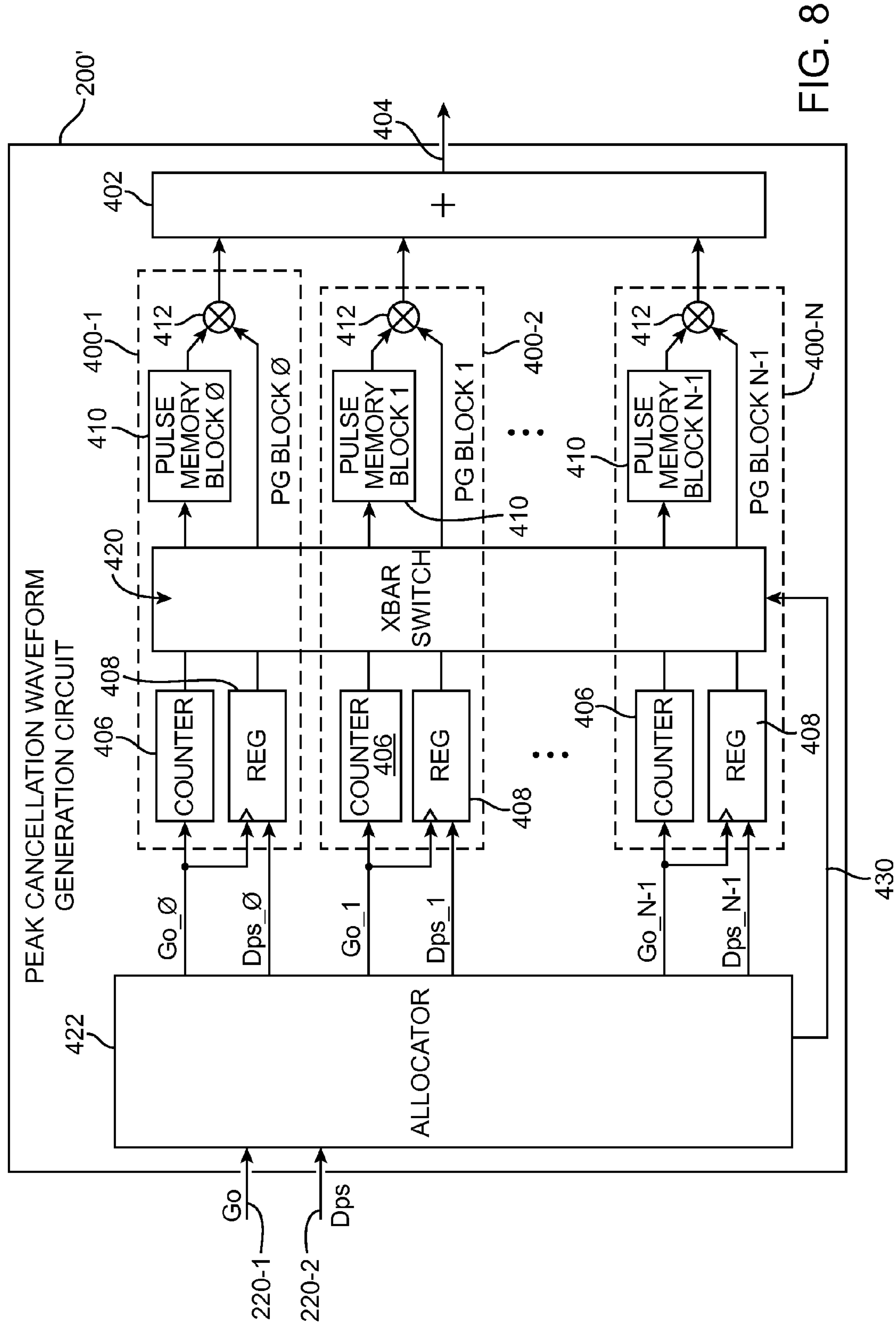
FIG. 8 is a diagram of an illustrative peak cancellation waveform generation circuit that includes an allocator and a crossbar switch in accordance with an embodiment of the present invention.

FIG. 8 shows another suitable arrangement of the present invention in which peak cancellation waveform generation circuit 200' includes multiple pulse generation blocks 400 (e.g., PG blocks 400-1, 400-2, . . . , 400-N), a summing circuit 402, an allocator circuit 422, and a crossbar switch 420. Allocator 422 may receive signals Go and Dps from peak detection circuit 154 via paths 220-1 and 220-2, respectively. When allocator 422 receives an asserted Go, allocator 422 may activate a selected one of pulse generation blocks 400 and may forward the received Dps to that pulse generation block.

For example, allocator 422 may activate the first pulse generation block 400-1 (i.e., PG block 0) by asserting signal Go__0 and outputting Dps__0 that is equal to the received Dps to PG block 0. As another example, allocator 422 may activate the second pulse generation block 400-2 (i.e., PG block 1) by asserting signal Go__1 and outputting Dps__1 that is equal to the received Dps to PG block 1. As another example, allocator 422 may activate the N-th pulse generation block 400-N (i.e., PG block N−1) by asserting signal Go_N−1 and outputting Dps_N−1 that is equal to the received Dps to PG block N−1.

Each pulse generation block 400 may include a counter 406, a register 408, a pulse memory block 410, and a multiplier 412. Pulse memory blocks 410 may collectively be used to store a single band-limited kernel impulse signal such as sinc pulse signal 390 of FIG. 5 (e.g., each pulse memory block 410 may be configured to store samples corresponding to a respective fraction of sinc pulse 390).

Counter 406 may be configured to monotonically increment a predetermined number of times that is equal to the total number of pulse samples that is stored in N pulse memory blocks 410 in response to detecting an asserted Go signal at its input. In an example in which circuit 200' has four PG blocks 410 each of which is configured to store 256 pulse samples, counter 406 may count up 1024 (256 multiplied by 4) times before looping back to its initial value. Counter 406 may have an output on which a corresponding count signal is provided. This count output signal may serve as an address signal for a selected one of pulse memory blocks 410.

Register 408 may have a data input that receives a scaling factor value from allocator 422 (e.g., register 408 in PG block 0 may receive Dps__0, register 408 in PG block 1 may receive Dps__1, . . . , and register 408 in PG block N−1 may receive Dps_N−1), a clock input that receives a Go signal from allocator 422 (e.g., register 408 in PG block 0 may receive Go__0, register 408 in PG block 1 may receive Go__1, . . . , and register 408 in PG block N−1 may receive Go_N−1), and a data output on which a latched scaling factor may be provided (e.g., register 408 may latch the scaling factor received at its input in response to a rising edge in the received Go signal and may present the latched scaling factor at its output).

Crossbar switch 420 may be used to switchably couple a given counter 406 and a register 408 associated with that given counter 406 to any one of pulse memory block 410 and multipliers 412 (e.g., multiplier 412 may have a first input that is switchably coupled to the count output of a counter 406 via a corresponding pulse memory block 410 and may have a second input that is switchably coupled to the data output of the associated register 408). For example, consider a scenario in which a first counter 406 and a first register 408 in PG block 0 detects an asserted Go__0. During a first time period when first counter 406 is counting from its initial value to a first target value, first counter 406 may be coupled to first multiplier 412 in PG block 0 via pulse memory block 0 and first register 408 may be coupled to that first multiplier 412. The first target value may be equal to the number of pulse samples that are stored in one pulse memory block 410.

During a second time period when first counter 406 is counting from the first target value to a second target value, first counter 406 may be coupled to a second multiplier 412 in PG block 1 via pulse memory block 1 and first register 408 may be coupled to that second multiplier 412. The difference between the second target value and the first target value may be equal to the number of pulse samples that are stored in one pulse memory block 410. Processing may continue in this way until first counter 406 and first register 408 have been coupled to all N multipliers 412. First counter 406 may loop back to its initial count value after it has reached its N-th target value (e.g., a target value that is equal to the sum of the total number of pulse samples stored in each of pulse memory blocks 410 in circuit 200'). N separate peak cancellation sub-pulses can be respectively generated using the N multipliers 412 and can then be combined to form a single peak cancellation pulse using summing circuit 402.

Allocator 422 may control the routing of crossbar switch 420 by sending appropriate control signals to switch 420 via control path 430. In another suitable arrangement, the configuration of switch 420 may be controlled based on selected bits generated at the output of counters 406 (e.g., based on a portion of the most significant bits at the output of counters 406).

A given multiplier 412 may only be coupled to one of counters 406 and associated registers 408. Crossbar switch 420 may, however, be used to perform routing for more than one counter 406 and register 408 at a time. For example, while first counter 406 and first register 408 in PG block 1 is coupled to second multiplier 412 in PG block 1, second counter 406 and second register 408 in PG block 1 may be coupled to first multiplier 412 in PG block 0. Operating PG blocks 400 in this multiplexed approach can achieve similar throughput as the pipeline architecture described in connection with FIG. 4. When allocator 422 is asserting Go signals at maximum frequency, it is possible for each counter 406 and register 408 to be coupled to a different respective multiplier 412 such that each PG block 400 is generating pulse cancellation sub-pulses in parallel.

Figure 9:
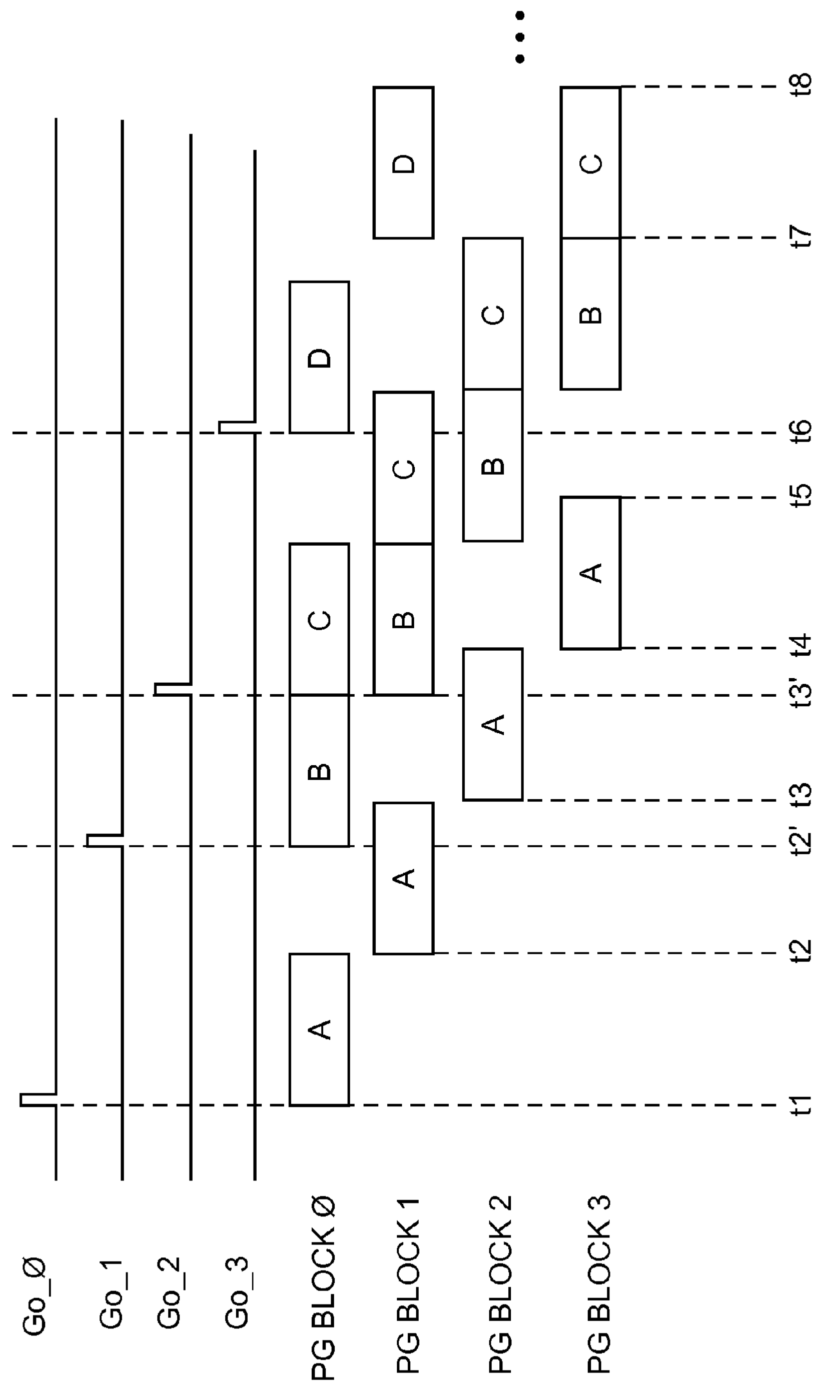
FIG. 9 is a timing diagram illustrating the operation of the peak cancellation waveform generation circuit of FIG. 8 in accordance with an embodiment of the present invention.

FIG. 9 is a timing diagram illustrating the operation of peak cancellation waveform generation circuit 200' of the type described in connection with FIG. 8. At time t1, allocator 422 may assert signal Go__0. Signal Go__0 being asserted may configure switch 420 to couple first counter 406 and first register 408 in PG block 0 to multiplier 412 in PG block 0 to begin generation of a first sub-pulse A (e.g., counter 406 in the first pulse generation block may begin incrementing at time t1).

At time t2 (when first counter 406 has reached its first target value), switch 420 may be reconfigured to couple first counter 406 and first register 408 to multiplier 412 in PG block 1 to begin generation of a second sub-pulse A (e.g., first counter 406 may being incrementing towards its second target value at time t2).

At time t3 (when first counter 406 has reached its second target value), switch 420 may be reconfigured to couple first counter 406 and first register 408 to multiplier 412 in PG block 2 to begin generation of a third sub-pulse A (e.g., first counter 406 may being incrementing towards its third target value at time t3).

At time t4 (when first counter 406 has reached its third target value), switch 420 may be reconfigured to couple first counter 406 and first register 408 to multiplier 412 in PG block 3 to begin generation of a fourth sub-pulse A (e.g., first counter 406 may being incrementing towards its fourth target value at time t4).

At time t5 (when first counter 406 has reached its fourth target value), summing circuit 402 may be used to combine the output of the four sub-pulses A with other cancellation pulses (e.g. sub-pulses B) to form one complete peak cancelling pulse 404 that can be used to cancel the detected peak which triggered the assertion of Go__0 at time t1 concurrently with other triggered assertions (e.g., Go__1). First counter 406 may then be reset to its initial value and may remain at the reset state until another Go__0 is asserted.

In the example of FIG. 9, allocator 422 may assert Go__1 at time t2' (while first counter 406 and first register 408 are coupled to multiplier 412 in PG block 1). At this time, since multiplier 412 in PG block 0 is no longer in use, second counter 406 and second register 408 in PG block 1 may be temporarily coupled to first multiplier 412 in PG block 0 to generate a first sub-pulse B. Four sub-pulses B may be generated using multipliers 412 in the respective PG blocks 400 and combined at time t7.

Similarly, allocator 422 may assert Go__2 at time t3' (while first counter 406 and first register 408 are coupled to multiplier 412 in PG block 2 and immediately after second counter 406 and second register 408 is switched from being coupled to first multiplier 412 in PG block 0 to second multiplier 412 in PG block 1). At this time, since multiplier 412 in PG block 0 is no longer in use by second counter 406 and second register 408, third counter 406 and third register 408 in PG block 2 may be temporarily coupled to first multiplier 412 in PG block 0 to generate a first sub-pulse C. Four sub-pulses C may be generated using multipliers 412 in the respective PG blocks 400 and combined at time t8.

Similarly, allocator 422 may assert Go__3 at time t6 (while second counter 406 and second register 408 are coupled to multiplier 412 in PG block 2 and while third counter 406 and third register 408 are coupled to multiplier 412 in PG block 1). At this time, since multiplier 412 in PG block 0 is no longer in use by third counter 406 and third register 408, fourth counter 406 and fourth register 408 in PG block 3 may be temporarily coupled to first multiplier 412 in PG block 0 to generate a first sub-pulse D. Four sub-pulses D may be generated using multipliers 412 in the respective PG blocks 400 in a similar pipeline fashion and may be subsequently combined using circuit 402.

The example of FIG. 9 that illustrates the operation of circuit 200' having only four PG blocks 400 is merely illustrative and does not serve to limit the scope of the present invention. If desired, circuit 200' may include more than four or less than four pulse generation blocks 400, where counters 406 and registers 408 can be switchably coupled to appropriate multipliers 412 using crossbar switch 420.

As described in connection with FIG. 7, peak cancellation waveform generation circuitry 200 may include two series-connected circuits 200' for performing two peak cancellation iterations. In another suitable embodiment of the present invention, circuitry 200 may only include a single peak cancellation waveform generation circuit 200' that is implemented using dual-port pulse memory blocks and that can achieve the same results as circuitry 200 of FIG. 7 using only half the amount of required pulse memory.

Figure 10:
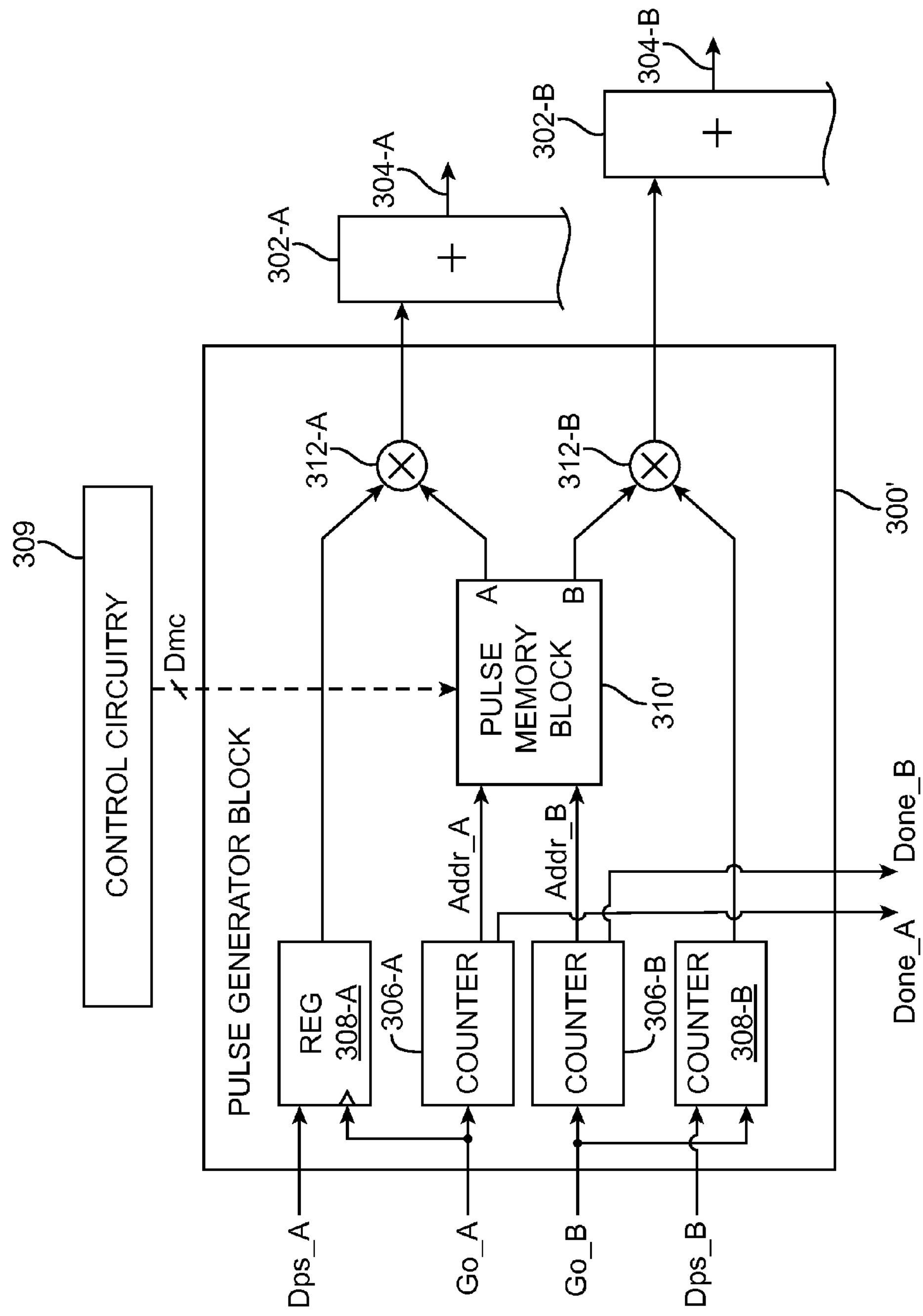
FIG. 10 is a diagram of an illustrative pulse generator block implemented using dual-port memory elements in accordance with an embodiment of the present invention.

FIG. 10 is a diagram of a pulse generation block 300' that includes a dual-port pulse memory block 310' (e.g., a memory block implemented using memory elements with at least two read-write ports A and B), counter 306-A that is used for providing a port A address signal Addr_A (e.g., an address signal for controlling which pulse samples are currently being read out from port A), counter 306-B that is used for providing a port B address signal Addr_B (e.g., an address signal for controlling which pulse samples are currently being read out from port B), register 308-A that is used for storing scaling factors Dps_A associated with samples read out from port A, register 308-B that is used for storing scaling factors Dps_B associated with samples read out from port B, multiplier 312-A for generating port A sub-pulses, and multiplier 312-B for generating port B sub-pulses.

Peak cancellation waveform generation circuit 200' may include multiple pulse generator blocks 300'. Multipliers 312-A in each of the multiple PG blocks 300' may be coupled to port A summing circuit 302-A, whereas multipliers 312-B in each of the multiple PG blocks 300' may be coupled to port B summing circuit 302-B. Summing circuit 302-A may be used to generate at its output 304-A a first cancellation waveform representing a first cancellation pulse that would have been generated by circuit 200'-1 during a first iteration while summing circuit 302-A may be used to generate at its output 304-B a second cancellation waveform representing a second cancellation pulse that would have been generated by circuit 200'-2 during a second iteration (see, e.g., FIG. 7).

Counter 306-A and register 308-A may receive signal Go_A, whereas counter 306-B and register 308-B may receive signal Go_B from peak detection circuit 154. Control circuitry 309 may also be used to provide additional memory control bits Dmc to pulse memory block 310' to ensure proper operation. Pulse generation block 300' as shown in FIG. 10 may be used to implement the peak cancellation waveform generation circuit architecture of either FIG. 4 or 8. If used in the pipeline configuration of FIG. 4, counters 306-A and 306-B may generate signals Done_A and Done_B, respectively (see, FIG. 10). If used in the multiplexing configuration of FIG. 8, done signals need not be generated by the counters.

Figure 11:
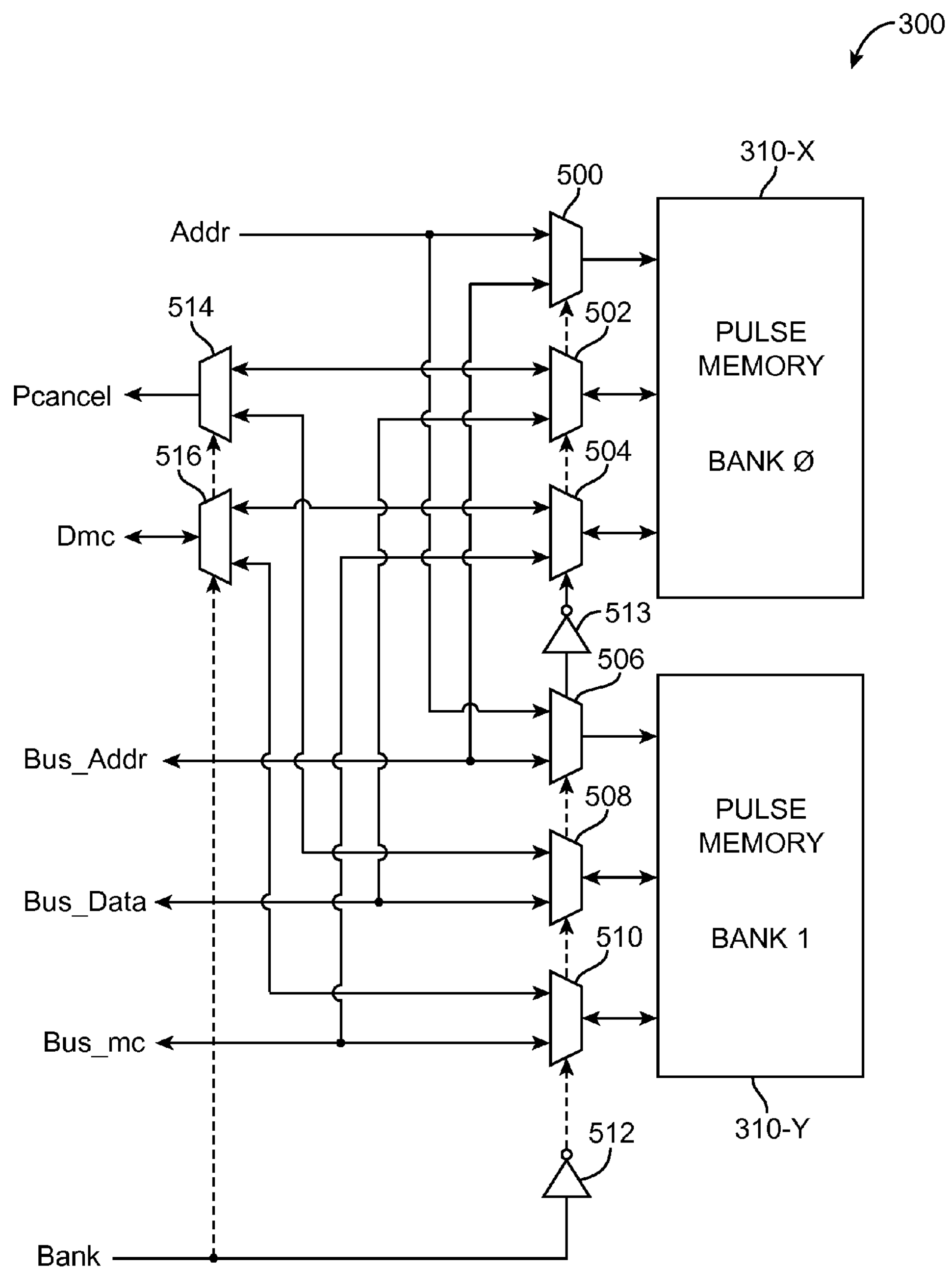
FIG. 11 is a diagram of an illustrative pulse generator block that is implemented using single-port memory and that is capable of supporting dual-bank operations in accordance with an embodiment of the present invention.

In another suitable arrangement of the present invention, pulse generation block 300 may include multiple banks of pulse memory for generating shadow cancellation pulses (e.g., for generating successive cancellation pulses at different frequencies during operation of radio access technologies that perform frequency hopping). As shown in FIG. 11, pulse generation block 300 may include a first pulse memory bank 310-X (i.e., bank 0) and a second pulse memory bank 310-Y (i.e., bank 1). Banks 310-X and 310-Y may be implemented using single-port memory.

Counter 306 in PG block 300 may provide address signal Addr. Control signals such as Dmc, Bank, and bus signals Bus_Addr, Bus_Data, and Bus_mc may be provided from or conveyed to control circuitry 309. In particular, a selected one of Addr and Bus_Addr may be routed to bank 0 or bank 1 via multiplexers 500 and 506, respectively. Similarly, a selected one of Dmc and Bus_mc may be routed to bank 0 or bank 1 via multiplexers 504 and 510, respectively. Depending on the state of multiplexer 516, control circuitry 309 may provide memory control bits Dmc to either bank 0 or bank 1. Circuits 502, 504, 508, 510, and 516 that are operable to route signals in either direction may sometimes be referred to as multiplexing/de-multiplexing (mux/demux) elements.

Only one of the two pulse memory banks is "active" at any given point in time. Consider a first time period in which bank 0 is active and bank 1 is inactive (or idle). During the first time period, pulse samples can be read out from active bank 0 via multiplexers 502 and 514, where the read out sub-pulse signal Pcancel can be fed to the corresponding multiplier 312 in PG block 300. At the same time, idle bank 1 can be loaded with an updated impulse signal by writing desired Bus_Data into bank 1 via multiplexer 508 (e.g., the idle bank may be loaded with an updated sync pulse that is centered at a new frequency). Each of multiplexers 506, 508, and 510 may receive an inverted version of signal Bank via inverter 512, whereas multiplexers 500, 502, and 504 may receive a non-inverted version of signal Bank via inverters 512 and 513. Multiplexers 514 and 516 may also receive the non-inverted version of Bank.

A second time period may follow the first time period in which bank 1 becomes idle and bank 1 is activated. During the second time period, pulse samples can be read out from active bank 1 via multiplexers 508 and 514, where the read out sub-pulse signal Pcancel can be fed to the corresponding multiplier 312 in PG block 300. At the same time, idle bank 0 can be loaded with an updated impulse signal by writing desired Bus_Data into bank 0 via multiplexer 502. Generation of signal Pcancel can alternate between the two pulse memory banks in this way to generate successive pulse sample signals at different frequencies. In the example of FIG. 11, signal Bank may be driven to a logic "0" to activate bank 0 or may be driven to a logic "1" to activate bank 1.

The configuration of pulse generation block 300 in FIG. 11 that includes two pulse memory banks implemented using single-port memory is merely illustrative and does not serve to limit the scope of the present invention. If desired, PG block 300 of FIG. 11 may be used in circuit 200' of the type described in connection with FIG. 4 and/or FIG. 8.

Figure 12:
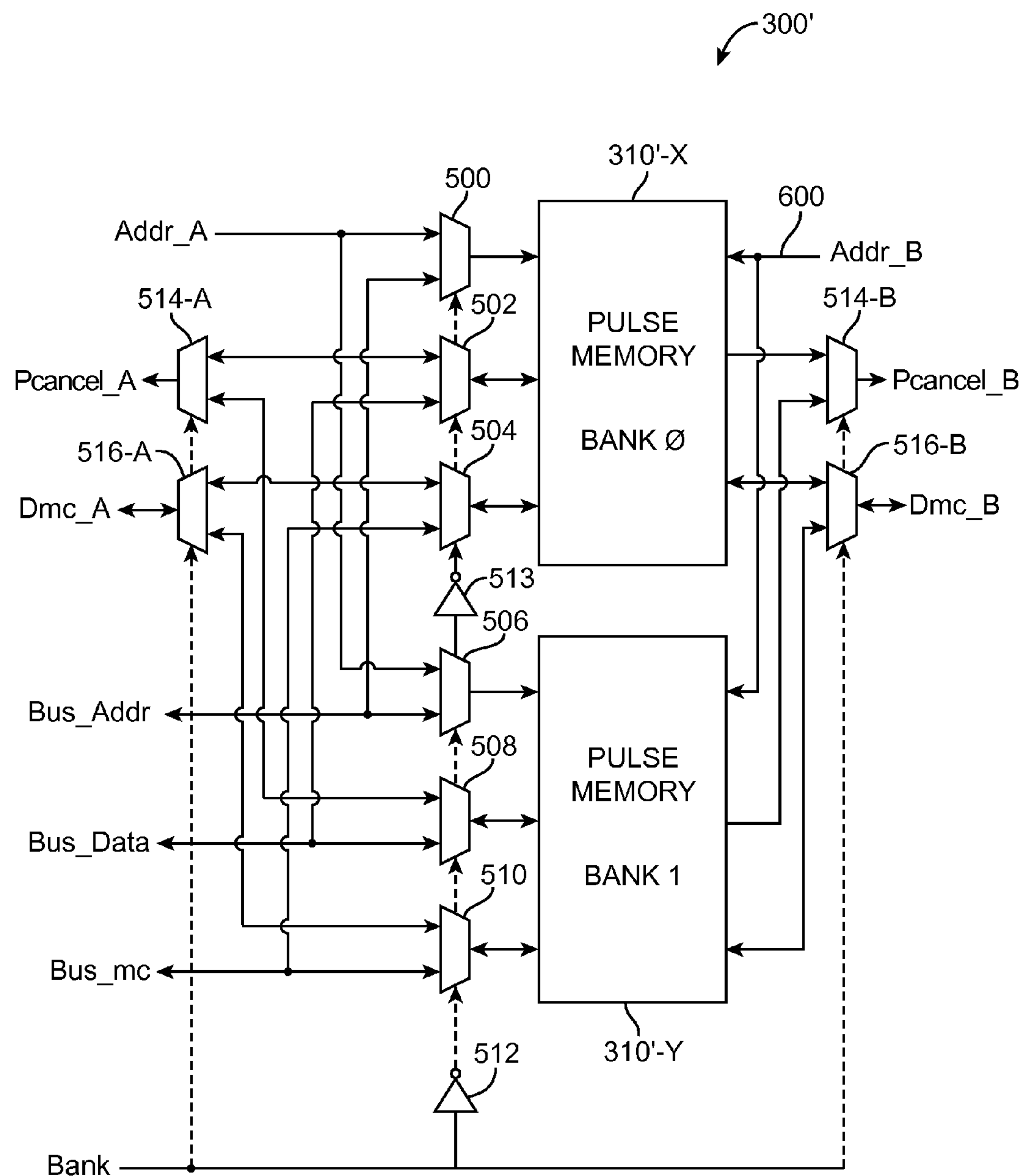
FIG. 12 is a diagram of an illustrative pulse generator block that is implemented using dual-port memory and that is capable of supporting dual-bank operations in accordance with an embodiment of the present invention.

In another suitable arrangement, pulse generation block 300' may include pulse memory banks 0 and 1 implemented using dual-port memory banks 310'-X and 310'-Y, respectively (see, e.g., FIG. 12).

Counter 306-A in PG block 300' may provide address signal Addr_A, whereas counter 306-B in the same PG block 300' may provide address signal Addr_B (FIG. 10). Control signals such as Dmc_A, Dmc_B, Bank, and bus signals Bus_Addr, Bus_Data, and Bus_mc may be provided from or conveyed to control circuitry 309. A selected one of Addr_A and Bus_Addr may be routed to bank 0 or bank 1 via multiplexers 500 and 506, respectively. Signal Addr_B may be routed directly routed to banks 0 and 1 via path 600. A selected one of Dmc_A and Bus_mc may be routed to bank 0 or bank 1 via multiplexers 504 and 510, respectively. Depending on the state of port A multiplexer 516-A, control circuitry 309 may provide memory control bits Dmc_A to either bank 0 or bank 1. Depending on the state of port B multiplexer 516-B, control circuitry 309 may provide Dmc_B to either bank 0 or bank 1.

Only one of the two pulse memory banks is "active" at any given point in time. Consider a first time period in which bank 0 is active and bank 1 is inactive (or idle) During the first time period, pulse samples can be read out from port A of active bank 0 via multiplexers 502 and 514-A, where the read out sub-pulse signal Pcancel_A can be fed to the corresponding multiplier 312-A in PG block 300'. At the same time, pulse samples can be read out in parallel from port B of active bank 1 via multiplexer 514-B, where the read out sub-pulse signal Pcancel_B can be fed to the corresponding multiplier 312-B in PB block 300'. During the first time period, idle bank 1 can be loaded with an updated impulse signal by writing desired Bus_Data into bank 1 via multiplexer 508 (e.g., the idle bank may be loaded with an updated sync pulse that is centered at a new frequency). Each of multiplexers 506, 508, and 510 may receive an inverted version of signal Bank via inverter 512, whereas multiplexers 500, 502, 504, 514-A, 514-B, 516-A, and 516-B may receive a non-inverted version of Bank.

A second time period may follow the first time period in which bank 1 becomes idle and bank 1 is activated. During the second time period, pulse samples can be read out from ports A and/or B of active bank 1, where the read out sample signals Pcancel_A can be fed to the corresponding multiplier 312-A in PG block 300' and where the read out sample signals Pcancel_B can be fed to the corresponding multiplier 312-3 in PG block 300'. At the same time, idle bank 0 can be loaded with an updated impulse signal by writing desired Bus_Data into bank 0 via multiplexer 502. Generation of sub-pulses Pcancel_A and Pcancel_B can alternate between the two pulse memory banks in this way to generate successive pulse sample signals at different frequencies. In the example of FIG. 12, signal Bank may be deasserted to activate bank 0 or may be asserted to activate bank 1.

The configuration of pulse generation block 300' in FIG. 12 that includes two pulse memory banks implemented using dual-port memory is merely illustrative and does not serve to limit the scope of the present invention. If desired, PG block 300' of FIG. 12 may be used in circuit 200' of the type described in connection with FIG. 4 and/or FIG. 8.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:

a first pulse generation circuit having a first pulse memory block that stores a first portion of a pulse signal; and a second pulse generation circuit having a second pulse memory block that stores a second portion of the pulse signal that is different than the first portion.

2. The circuitry defined in claim 1, wherein the first pulse memory block is configured to store a portion of a sinc pulse, and wherein the second pulse memory block is configured to store another portion of the sinc pulse.

3. The circuitry defined in claim 1, wherein the first pulse generation circuit is operable to output a first sub-pulse based on the first stored portion, wherein the second pulse generation circuit is operable to output a second sub-pulse based on the second stored portion, the circuitry further comprising:

a summing circuit operable to combine the first and second sub-pulses to form a peak cancellation pulse.

4. The circuitry defined in claim 1, wherein the first pulse generation circuit further includes a first counter, wherein the second pulse generation circuit further includes a second counter, and wherein the first and second counters are coupled in series.

5. The circuitry defined in claim 4, wherein the first pulse generation circuit further includes a first register, wherein the second pulse generation circuit further includes a second register, and wherein the first and second registers are coupled in series.

6. The circuit defined in claim 5, wherein the first pulse generation circuit further includes a first multiplier that is coupled to the first pulse memory block and the first register, and wherein the second pulse generation circuit further includes a second multiplier that is coupled to the second pulse memory block and the second register.

7. The circuitry defined in claim 1, further comprising:

a peak detection circuit that receives an input waveform and that is operable to detect undesired peaks in the input waveform, wherein the peak detection circuit has an output that is directly coupled to a selected one of first and second pulse generation circuits.

8. The circuitry defined in claim 1, further comprising:

an allocator circuit operable to sequentially provide control signals to the first and second pulse generation circuits.

9. The circuitry defined in claim 1, further comprising:

a counter in the first pulse generation circuit; and a crossbar switch operable to couple the counter to a selected one of the first and second pulse memory blocks.

10. The circuit defined in claim 9, wherein the first pulse generation circuit further includes a register and a first multiplier, wherein the second pulse generation circuit further includes a second multiplier, and wherein the crossbar switch is further operable to switchably couple the register to a selected one of the first and second multipliers.

11. The circuit defined in claim 1 wherein the first and second pulse memory blocks comprise dual-port memory elements.

12. Circuitry, comprising:

a dual-port pulse memory block operable to store a fraction of a band-limited pulse signal.

13. The circuitry defined in claim 12, further comprising:

a first counter operable to supply a first address signal to the dual-port pulse memory block; and a second counter operable to supply a second address signal to the dual-port pulse memory block.

14. The circuitry defined in claim 12, further comprising:

a first multiplier operable to receive data from a first port of the dual-port pulse memory block; and a second multiplier operable to receive data from a second port of the dual-port pulse memory block.

15. The circuitry defined in claim 14, further comprising:

a first register operable to supply a first scaling factor to the first multiplier; and a second register operable to supply a second scaling factor to the second multiplier, wherein the first multiplier is operable to output a first sub-pulse based on the first scaling factor, and wherein the second multiplier is operable to output a second sub-pulse based on the second scaling factor.

16. A method of operating a pulse generation circuit having a first memory bank and a second memory bank, comprising:

reading data from the first memory bank; and while data is being read from the first memory bank, loading a new pulse signal into the second memory bank.

17. The method defined in claim 16, wherein loading the second memory bank comprises loading the second memory bank with data corresponding to a fraction of a sinc pulse signal.

18. The method defined in claim 16, further comprising:

reading data from the second memory bank; and while data is being read from the second memory bank, loading the first memory bank with another pulse signal.

19. The method defined in claim 16, further comprising:

with a multiplying circuit, receiving the data from the first memory bank and receiving a corresponding scaling factor; and generating a sub-pulse by scaling the received data by the scaling factor using the multiplying circuit.

20. The method defined in claim 16, further comprising:

storing a first band-limited pulse that is centered at a first frequency with the first memory bank; and storing a second band-limited pulse that is centered at a second frequency that is different than the first frequency with the second memory bank.

* * * * *